United States Patent [19]

Pryor et al.

[11] Patent Number: 4,805,009
[45] Date of Patent: Feb. 14, 1989

[54] HERMETICALLY SEALED SEMICONDUCTOR PACKAGE

[75] Inventors: Michael J. Pryor, Woodbridge; Richard A. Eppler, Cheshire; Edward F. Smith, III, Madison, all of Conn.; Sheldon H. Butt, Godfrey, Ill.

[73] Assignee: Olin Corporation, New Haven, Conn.

[21] Appl. No.: 710,777

[22] Filed: Mar. 11, 1985

[51] Int. Cl.⁴ .......................................... H01L 23/48
[52] U.S. Cl. ...................... 357/70; 357/74; 357/67; 420/486; 428/433; 501/21
[58] Field of Search ................ 357/74, 70, 81, 67; 501/15, 21, 22; 428/422, 469, 433, 209; 420/452, 457, 479, 485, 486

[56] References Cited

U.S. PATENT DOCUMENTS

| | | | |
|---|---|---|---|
| 3,341,649 | 9/1967 | James | 357/74 X |
| 3,397,045 | 8/1968 | Winter | 29/191 |
| 3,676,292 | 7/1972 | Pryor et al. | 428/469 X |
| 3,698,964 | 10/1972 | Caule et al. | 148/31.5 |
| 3,726,987 | 4/1973 | Pryor et al. | 357/81 X |
| 3,728,177 | 4/1973 | Caule | 156/3 |
| 3,730,779 | 5/1973 | Caule et al. | 148/6.35 |
| 3,810,754 | 5/1974 | Ford et al. | 75/171 |
| 3,837,895 | 9/1974 | Pryor et al. | 428/422 |
| 3,937,638 | 2/1976 | Plewes | 148/12.7 |
| 3,954,486 | 5/1976 | Francel et al. | 106/53 |
| 3,963,505 | 6/1976 | Dumesnil | 106/47 R |
| 4,109,054 | 8/1978 | Burgyan | 428/433 |
| 4,109,096 | 8/1978 | Dehaine | 357/70 X |
| 4,131,478 | 12/1978 | Davis | 501/22 X |
| 4,135,038 | 1/1979 | Takami | 428/427 |
| 4,149,910 | 4/1979 | Popplewell | 428/433 X |
| 4,185,139 | 1/1980 | Smernos | 428/404 |
| 4,330,599 | 5/1982 | Winter et al. | 428/675 |
| 4,362,262 | 12/1982 | Winter et al. | 228/117 |
| 4,366,117 | 12/1982 | Tsuji | 420/481 |
| 4,404,264 | 9/1983 | Tatum et al. | 428/573 |
| 4,410,927 | 10/1983 | Butt | 361/386 |
| 4,429,022 | 1/1984 | Breedis et al. | 428/675 |
| 4,434,016 | 2/1984 | Saleh et al. | 420/486 X |
| 4,461,924 | 7/1984 | Butt | 174/52 FP |
| 4,466,939 | 8/1984 | Kim et al. | 420/485 |
| 4,480,262 | 10/1984 | Butt | 357/74 |
| 4,491,622 | 1/1985 | Butt | 428/632 |
| 4,493,944 | 1/1985 | Snell | 507/15 X |
| 4,498,121 | 2/1985 | Breedis et al. | 361/401 |
| 4,500,028 | 2/1985 | Breedis et al. | 228/117 |
| 4,500,605 | 2/1985 | Fister et al. | 428/469 |
| 4,521,469 | 6/1985 | Butt et al. | 428/35 |
| 4,524,238 | 6/1985 | Butt | 357/74 X |
| 4,525,422 | 6/1985 | Butt et al. | 428/418 |
| 4,532,222 | 7/1985 | Butt | 501/32 |
| 4,542,259 | 9/1985 | Butt | 174/52 FP |
| 4,569,692 | 2/1986 | Butt | 75/235 |
| 4,570,337 | 2/1986 | Butt | 29/840 |
| 4,577,056 | 3/1986 | Butt | 174/52 FP |
| 4,594,770 | 6/1986 | Butt | 29/588 |
| 4,607,276 | 8/1986 | Butt | 357/74 X |
| 4,625,400 | 12/1986 | Fister | 29/879 |
| 4,649,083 | 3/1987 | Fister et al. | 428/469 |
| 4,656,499 | 4/1987 | Butt | 357/74 |
| 4,659,404 | 4/1987 | Butt | 156/62.2 |
| 4,668,471 | 5/1987 | Futatsuka et al. | 420/477 |

FOREIGN PATENT DOCUMENTS

| | | |
|---|---|---|
| 3002353 | of 0000 | Fed. Rep. of Germany . |
| 2700273 | 7/1978 | Fed. Rep. of Germany . |
| 0159947 | 4/1983 | Fed. Rep. of Germany ........ 501/16 |
| 60-45698 | of 0000 | Japan . |
| 56-90546 | 7/1981 | Japan ..................... 357/67 |
| 1569028 | 6/1980 | United Kingdom . |

OTHER PUBLICATIONS

Lineback, "Clad Lead Frames Take Out More Heat", *Electronics*, Aug. 11, '81, pp. 38–39.

*Primary Examiner*—Andrew J. James
*Assistant Examiner*—William A. Mintel
*Attorney, Agent, or Firm*—Gregory S. Rosenblatt; Paul Weinstein

[57] ABSTRACT

The present invention is directed to several embodiments of a hermetically sealed semiconductor package. One embodiment is constructed from a substrate of a first copper alloy, a cover member of a second copper alloy and a lead frame of a third copper alloy. A low melting point sealing glass composite is disposed between the cover member and the substrate for sealing the lead frame therebetween. The third copper alloy is precipitation hardenable and has excellent softening resistance at glass sealing temperatures as compared with other conventionally used alloys. In another embodiment, a clad composite having a core of the third copper alloy and cladding layer of a copper alloy having a low oxidation rate may be advantageously used for the lead frame.

59 Claims, 3 Drawing Sheets

HERMETICALLY SEALED SEMICONDUCTOR PACKAGE

While the invention is subject to a wide range of applications, it is especially related to hermetically sealed semiconductor packages and the method of fabricating these packages. The invention is directed to the use of a thermally stable, glass sealable alloy for the package components and in particular for lead frame construction. These alloys are readily bonded to glass and have excellent softening resistance at glass sealing temperatures as compared with typical alloys used in conventional lead frame fabrication.

Hermetically sealed packages are used in applications requiring maximum reliability. These packages, typically of ceramic or metal components bonded together with a sealing glass, form an enclosure which is substantially impervious to the diffusion of water vapor or other contaminants.

A typical glass sealed semiconductor package is disclosed in U.S. patent application Ser. No. 643,530 entitled "Improved Semiconductor Package" by S. H. Butt, filed Aug. 23, 1984. FIG. 17 of that application illustrates a heremetically sealed package formed of a metal substrate, a metal lead frame and a metal cover. The material to fabricate these metal components preferably has the ability to form a continuous refractory oxide layer on its surface. Exemplary of this material is a copper base alloy consisting essentially of 2 to 12% aluminum and the balance copper, such as commercial alloy CDA 63800.

Another conventional technique for hermetically sealing semiconductor devices is to use window frame type packages as disclosed in U.S. patent application Ser. No. 685,864 entitled "Improved Hermetically Sealed Semiconductor Casing" by S. H. Butt, filed Dec. 24, 1984 (now. U.S. Pat. No. 4,656,499) These packages are fabricated by glass bonding a metal substrate to a first surface of a lead frame. A first surface of a seal ring is then bonded to a second surface of the lead frame. After the semiconductor device is mounted (die attach) in the enclosure formed by the substrate and seal ring, inner connections are made between the die and the lead frame, and then a cover is bonded to a second surface of the seal ring to seal the casing. The primary advantage of the window frame type package is that the bonding of the cover to the seal ring can be accomplished with glass, solder or other means at temperatures significantly below those used to form the hermetic glass to metal seal around the lead frame. The semiconductor device is, therefore, not subjected to the potentially destructive, high sealing temperatures generally associated with hermetic glass sealing. U.S. Pat. No. 4,656,499 specifically sets for that the metals or alloys to fabricate this type of hermetically sealed package have the ability to form a refractory oxide layer on their exposed surfaces, i.e. alloy CDA 63800. The solder glasses or ceramics used to bond these window frame semiconductor type packages together may be the same as those described in U.S. patent application Ser. No. 643,530 described hereinbefore.

A source of concern in glass sealing of semiconductor packages is the softening of the metal components and particularly the lead frame when subjected to glass sealing temperatures. Another potential problem is the need to achieve the required glass flow at the firing temperature.

The present invention address provide a hermetically sealed semiconductor package with significant thermal dissipation. The package component are selected from metal or alloy materials which are glass sealable and have significant strength after being subjected to sealing temperatures for the time needed to manufacture the packages. In order to achieve high levels of thermal dissipation, copper or aluminum are obvious contenders. Aluminum may be difficult from a processing point of view since it has a low melting temperature, i.e. about 650° C. and a very high coefficient of thermal expansion, $235 \times 10^{-7}$ in/in/°C. Copper or copper alloys, on the other hand, provide excellent material specifications including a melting temperature of about 1050° C. and a coefficient of thermal expansion of about $160 \times 10^{-7}$ to about $170 \times 10^{-7}$ in/in/° C. The material specifications of the selected metal or metal alloy establish the range of coefficients of thermal expansion for each component of the package system.

U.S. patent application Ser. No. 517,592 to S. H. Butt entitled "Clad Metal Leadframe Substrates" does disclose clad leadframes which are particularly suited for hermetically sealed ceramic dual-in-line integrated circuit packages (CERDIP). The metal clad composite is selected so that the coefficient of thermal expansion of the composite is comparable to that of the ceramic base and lid. Also, the claddings applied to the core are selected to resist the formation of copper-aluminum intermetallics. In one embodiment, an additional cladding is incorporated to increase the thermal dissipation of the leadframe.

There are references to claddings where the core is of stainless steel and the cladding is of copper or copper alloy. See Japanese Patent Document No. 609,546, July 1981; and an article entitled "Clad Lead Frames Take Out More Heat" by Lineback in *Electronics,* Aug. 11, 1981.

U.S. Pat. Nos. 4,498,121 and 4,500,028 to Breedis et al. assigned to a common assignee with the present application disclose a composite of a copper-zirconium alloy core cadded with a dissimilar copper alloy such as CDA 63800. These patents are distinguished from the present invention because the core material softens at the required glass sealing times and temperatures.

It is a problem underlying the present invention to provide a hermetically sealed, metal semiconductor package wherein the metal components and in particular the lead frame are glass sealable and maintain their strength after exposure to glass sealing temperatures.

It is an advantage of the present invention to provide a hermetically sealed semiconductor package which obviates one or more of the limitations and disadvantages of the described prior arrangements.

It is a yet further advantage of the present invention to provide a hermetically sealed semiconductor package wherein the lead frame maitains its strength after being subjected to thermal exposure for the time and temperature required for glass sealing.

It is a further problem of the present invention tp provide a hermetically sealed semiconductor package having at least the lead frame fabricated from a specific alloy component and sealed with a specific family of glasses having superior flow characteristics at the sealing temperature.

It is still a further problem of the present invention to provide a hermetically sealed semiconductor package having at least the lead frame fabricated as a tri-clad wherein the outer layers are readily glass sealable and the inner core layer is both glass sealable as well as able to maintain its strength at glass sealing temperatures.

Accordingly, there has been provided a first embodiment of an improved hermetically sealed semiconductor package and process for producing the package. The package is fabricated from a base substrate, cover member, and lead frame of thermally stable, glass sealable alloy(s). The alloy of the lead frame has a specified composition whose yield strength is not adversely affected by times and temperatures required for glass to metal sealing. Further, a low melting point, lead borate type sealing glass provides improved flow characteristics on alloy(s) of the lead frame, bonding to the base and lid. The alloys used for the cover and substrate may be the same as that of the lead frame or if desired, selected from other glass sealable, alloy material.

A second embodiment, similar to the first, has a tri-clad lead frame wherein the outer cladding layers are selected from an oxidation resistant copper alloy which is readily bonded to a sealing glass. The inner core layer of the clad lead frame is selected from a thermally stable, glass sealable alloy, as in the first embodiment, whose yield strength is not adversely affected by the times and temperatures required for glass to metal sealing.

The invention and further developments of the invention are now elucidated by means of preferred embodiments shown in the drawings.

Figure 1:
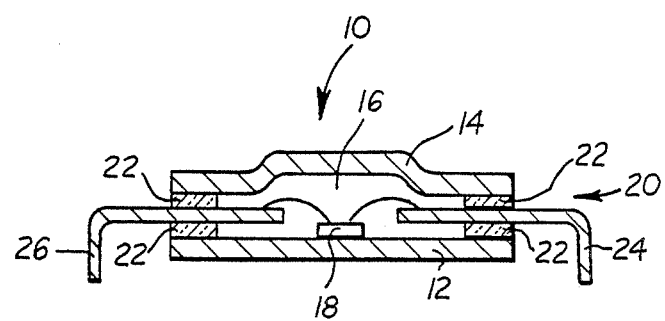
FIG. 1 is a cross section of a hermetically sealed semiconductor package based on the concepts set forth in the present invention.

The present invention covers a semiconductor package having a thermally stable, glass sealable alloy lead frame which maintains its strength after being heated for the amount of time and temperature required for glass sealing. Also the other components of the package may be formed of a similar alloy.

Lead borate type sealing glasses, as described in U.S. patent application Ser. No. 651,987 entitled "Sealing Glass Composite" by Smith et al., filed Sept. 19, 1984, (now abandoned), are thought to be particularly suitable for the present invention. The glass matrix of the preferred sealing glass composite is a lead borate type glass generally also containing one or more other glass components, such as bismuth, zinc, aluminum, silicon, barium, arsenic, tin, and tellurium which are normally present in their respective oxide forms. These lead borate type solder glasses usually have coefficients of thermal expansion of about 80 to about $130 \times 10^{-7}$ in-/in/°C. over the temperature range from ambient to their glass transition temperatures (typically about 300° C.).

Such glasses are used in forming vitreous seals and glass-ceramic or semicrystalline seals as known in the electronic packaging art. Weight percent compositional ranges are set forth below in Table I where the total content of all oxides is 100 percent.

TABLE I

| Oxide | Broad Range (wt. %) | Preferred Range (wt. %) |
|---|---|---|
| PbO | 70–85 | 75–85 |
| ZnO | 0–20 | 0.5–16 |
| B$_2$O$_3$ | 5–15 | 8–15 |
| SiO$_2$ | 0–10 | 0–5 |
| BaO | 0–3 | 0–2 |
| SnO$_2$ | 0–5 | 0–2 |
| CuO | 0–5 | 0–2 |

Other conventional glassmaking oxides such as CaO, Bi$_2$O$_3$, Na$_2$O, K$_2$O, Li$_2$O, CdO, and Fe$_2$O$_3$ can be included. However, it is preferred in many instances not to employ these ingredients but rather to constitute the glass matrix of essentially only those ingredients set forth in Table I above.

In accordance with the present invention, a particulate additive, having a high coefficient of thermal expansion as compared with that of the glass matrix, may be mixed with the lead borate glasses described above to adjust the coefficient of thermal expansion of the final glass composite to be in the range of about 140 to about $180 \times 10^{-7}$ in/in/° C. so as to be compatible with the CTE's of the metal or alloy components to which it is bonded. The particular is preferably calcium fluoride or barium fluoride. These materials have limited solubility in the sealing glass at the temperature and times required to practice this invention. The additive comprises particles having a size between about 1 to about 150 microns. Preferably, the particles have a size between about 10 to about 75 microns. The particle size is limited because smaller particles more readily dissolve in the glass during the sealing process and cause the sealing glass composite to lose the benefit of the high coefficient of thermal expansion additive. Conversely, if the particles are too large, there is inadequate dispersion of the particles and it is difficult or impossible to provide an adequately smooth surface to make final seal. The result is a loss of strength due to the formation of the voids between the interfaces of the particles. The filler or additive has a maximum critical volume content of up to about 60% volume of the glass matrix to prevent particle interlock. Preferably, the filler in the glass matrix is between about 15 to about 20 wt.% (about 30 to about 40 vol.%) for application to the alloy substrate. The filler in the glass matrix has a coefficient of thermal expansion (CTE) which is higher than the CTE of the glass. More importantly, the CTE of the filler must be higher than that of the metal substrate to which it is bonded in order that the CTE of the glass composite can approximate that of the substrate.

The calcium fluoride filler may be supplied as either a man-made, synthetic powder or as fluorspar, the naturally occuring mineral version of the compound. The filler is mixed with powdered sealing glass sized to pass through about 100 mesh or less and preferably 95% of the glass through about 400 mesh or less. The sealing glass typically is used to seal packages at a temperature between about 400° C. to about 450° C. The calcium fluoride additive remains inert but wettable at those temperatures. It is a critical aspect of the present invention that the filler is substantially insoluble in the glass matrix at the operative times and temperatures associated with the invention so that the particles remain intact and are not dissolved into the glass. Although it is desirable for a minimum amount of filler to dissolve in the matrix, it is within the scope of the present invention for a maximum of less than about 10 wt.% of the particulate additive to dissolve into the glass matrix. The limited solubility requirement is because the observed increase in thermal expansion arises from a physical mixture of glass and filler and not from a modification of the basic glass chemistry.

Fluorspar has a CTE in excess of about $220 \times 10^{-7}$ in/in/° C. By contrast, the CTE of metal alloy materials disclosed herein for use in the electronic packaging is significantly lower as indicated hereinbelow.

The glass may contain low levels of copper oxide (CuO). As demonstrated by the data set forth in U.S. patent application Ser. No. 651,987 entitled "Sealing Glass Composite", (now abandoned) the copper oxide addition to the glass has been established as being an effective amount of up to about 2 wt.% for affecting a strong glass to metal bond having improved capability for withstanding thermal shock. Preferably, copper oxide additions to the glass are within the range of about 0.1 to about 2 wt%. The preferred metal for fabricating the components of the present invention is a thermally stable, glass sealable alloy such as a precipitation hardenable alloy like the Cu-Ni-Al alloy disclosed in U.S. Pat. No. 4,434,016 entitled "Precipitation Hardenable Copper Alloy and Process" to Saleh et al. The alloy is designated as CDA 72400 herein for reference purposes. The alloy consists essentially of from about 10% to about 15% nickel, from about 1% to about 3% aluminum, up to about 1% manganese, from about 0.05% to less than about 0.5% magnesium and the balance copper. Silicon should not exceed about 0.05%, lead should be less than about 0.015%, zinc should be less than about 0.5% and phosphorous should be less than about 0.005%. Preferably, the alloy contains from about 11.5% to about 12.5% nickel, from about 1.8% to about 2.3% aluminum, from about 0.1% to about 0.3% magnesium, from about 0.2% to about 0.5% manganese and the balance copper. Preferably, silicon should not exceed about 0.005%. In a most preferred embodiment, the mangnesium is further limited to a range of from about 0.15% to about 0.25%. All of the percentage compositions which have been set forth herein are percentages by weight. The alloy of this invention may include other elements which do not adversely affect its properties. However, preferably other elements are included at no more than impurity levels so that the balance of the alloy is essentially copper.

CDA 72400 is an age hardenable alloy which achieves its strength by aging at a temperature of from about 400° to about 550° C. for from about 4 to about 24 hours. Depending on the amount prior cold work (from about 10 to about 40% reduction), yield strengths ranging from about 110 to about 127 ksi are obtained. This alloy has a coefficient of thermal expansion of between about $160 \times 10^{-7}$ to about $170 \times 10^{-7}$ in/in/° C. A high yield strength is particularly important for lead frame applications where the ability to withstand deformation during handling is required. A particularly important quality of a CDA 72400 lead frame is its ability to maintain its strength after thermal exposure during the glass sealing of the lead frame into the semiconductor package as described below. Generally, the sealing requires a temperature of up to about 430° C. for approximately 30 minutes. A limited time exposure to this temperature and time required for glass sealing has no adverse affect on the mechanical properties of the CDA 72400 alloy. In fact, in the areas where the lead frame is bent, some slight increase in yield strength is thought to result. The improved softening resistance of CDA 72400 as compared with other alloys frequently used for semiconductor packaging components is advantageous because it allows higher processing temperatures without any significant loss of strength.

The present invention is not restricted to apaplication of CDA 72400 but includes precipitation hardenable alloy system including beryllium containing copper alloys typified by the following commercial alloys: CDA 17000; 17200; 17300; 17500; 17600; and 17700.

Another suitable precipitation hardenable alloy is a magnesium, zirconium, chromium-copper alloy such as MZC® by Amex Corporation having a nominal composition of 0.06 Mg, 0.15 Zr, 0.4 Cr, and the remainder copper. Also nickel-phosphorus containing copper alloys may be suitable. They would typically have a nominal composition of 1.1 Ni, 0.25 P and the remainder copper. Copper-nickel-tin precipitation hardenable alloys such as CDA 72500 and the spinodal alloys as disclosed in U.S. Pat. No. 3,937,638 and typified by CDA 72900 are through to be suitable. Dispersion strengthened copper alloys typified by the Glidcop® materials produced by Glidden Metals, Inc. are also thought to be suitable. Further austenitic, AlSI (American Institute of Steel and Iron) 300 series stainless steels would seem to be suitable.

Alloys suitable for forming the semiconductor package components, other than the lead frame, include a copper or copper base alloy which has a low oxidation rate and/or is capable of forming a thin refractory oxide layer on at least the surface bonded to the sealing glass. An exemplary alloy capable of forming a refractory oxide layer contains an effective amount of up to about 12% aluminum and the balance copper. Preferably, the exemplary alloy consists essentially of from about 1 to 10% aluminum, 0.001 to 3% silicon and optionally, a grain refining element selected from the group consisting of iron up to 4.5%, chromium up to 1%, zirconium up to 0.5%, cobalt up to 1% and mixtures of these grain refining elements and the balance copper. In particular, CDA alloy 63800, as disclosed in U.S. Pat. No. 3,676,292 to Pryor et al., has been demonstrated as suitable. Impurities may be present in the alloy which do not significantly degrade the properties of the alloy or prevent bonding in a desired embodiment. C63800 has a coefficient of thermal expansion of about $170 \times 10^{-7}$ in/in/° C. The above described alloys are hardened by cold working. When work hardened alloys are exposed to high temperatures, they have relatively poor softening resistance. This is particularly the case when comparing these metals to a precipitation hardenable alloy like CDA 72400.

Metals of the above described composition range are thought to be glass sealable with a lead borate type glass sealing matrix of the type described hereinabove. The glass may be applied alone or as a mixture of a low melting point glass matrix and a subtantially insoluble, high thermal expansion additive such as calcium fluoride or barium fluoride.

The CDA 72400 alloy can be successfully used to form a semiconductor package 10 of the type illustrated in FIG. 1. That package includes a metal base member 12. A metal housing member 14 is mounted upon the base member and shaped to provide a hollow enclosure 16 for receiving an electronic component 18. A thermally stable, glass sealable alloy lead frame 20 is sealed between the cover 14 and base 12 by a lead borate type glass and filler 22 as described hereinabove. The lead frame 20 has terminal leads 24 and 26 projecting between the base and cover member external to the casing 10. The terminal leads are glass sealed and bonded between the base member and the cover member to hermetically seal the electronic device 18 within the housing. The sealing steps require heating the package components to a temperature of between about 400° C. to about 475° C. for a cumulative total time period of about the to about sixty minutes, preferably about 30 minutes. By using a glass sealable, thermally stable alloy such as precipitation hardenable CDA 72400 throughout the semiconductor package, improved strength of the package may be achieved. In fact, the lead frame 20 may actually become stronger from the exposure to the glass sealing temperatures for the required time. It is also within the terms of the present invention to fabricate the lead frame of a thermally stable, glass sealable alloy and other alloy systems such as C63800 to fabricate the cover and/or the base despite their poor softening resistance as compared to the CDA 72400 alloy. An important consideration in selecting the alloys is that each of the package components has a comparable CTE. It is thought that the metal or alloy components will have a CTE being about $140 \times 10^{-7}$ and about $180 \times 10^{-7}$ in/in/° C. Preferably, the CTE of the components and glass composite will be between about $160 \times 10^{-7}$ and $170 \times 10^{-7}$ in/in/° C. It is essential to use a lead borate type glass formulated to achieve a compatible CTE between the glass and the alloy components which results in hermetic, mechanical stable bonds or seals.

The lead borate type glasses have superior flow characteristics on the surface of the CDA 72400 alloy. They easily flow across the surface of the lead frame to provide a continuous pinhole free seal. By forming the base member and the cover member from thermally stable alloys such as CDA 72400, the superior flow characteristics are advantageously applied during the fabrication of the package.

The cover and/or the base may also be formed of a clad material wherein the innermost layer is a glass sealable alloy as described above and the outermost layer from the enclosure containing the semiconductor device may be formed of any desirable metal or alloy having properties such as high strength or high thermal conductivity. Examples of this type of construction are disclosed in U.S. patent application Ser. No. 685,864, entitled "Improved Hermetically Sealed Semiconductor Casing" by S. H. Butt (now U.S. Pat. No. 4,656,499 and in U.S. patent application Ser. No. 651,985, entitled "High Density Packages" by S. H. Butt (now U.S. Pat. No. 4,542,259.

Figure 2:
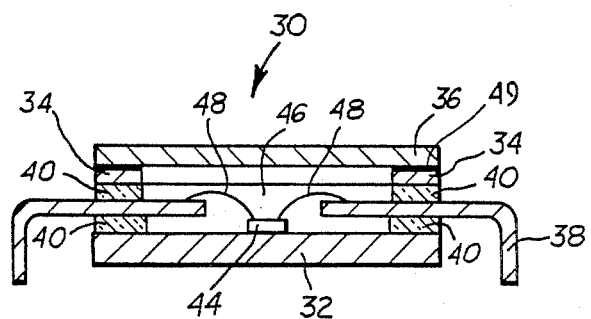
FIG. 2 is a cross section of a hermetically sealed window frame type semiconductor pacakge based on the concepts set forth in the present invention.

The present invention may also be advantageously applied to a semiconductor package 30 of the type shown in FIG. 2. This package includes a metal base member 32, a metal seal ring 34, a metal cover 36, and a metal lead frame 38. The lead frame 38 is sealed by glass 40 between the ring member 34 and the base member 32. Subsequent to this step, an electronic component 44 may be affixed within the enclosure 46 and electrically connected by wires 48 to the lead frame 38. Finally, the cover member 36 is bonded to the top surface of the seal ring by any desired sealing means 49 such as a glass, an oxygen stable solder or an adhesive. As with the embodiment of FIG. 1, each of the metal components may be advantageously formed of a thermally stable, glass sealable alloy such as CDA 72400. The glass 40 is preferably of the lead borate type modified by a filler to adjust the CTE to be compatible and preferably match that of the metal components as described hereinabove. The improved softening resistance of the thermally stable alloy provides excellent retention of room temperature mechanical properties after subjecting the package to the glass sealing temperature for the required time. If desired, other glass sealable alloy systems such as C63800 may be used for the base member, seal ring member and the cover. Further, it is also within the terms of the preset invention to form the cover 36 of any other metal or alloy which can be successfully bonded to the seal ring 34.

Figure 3:
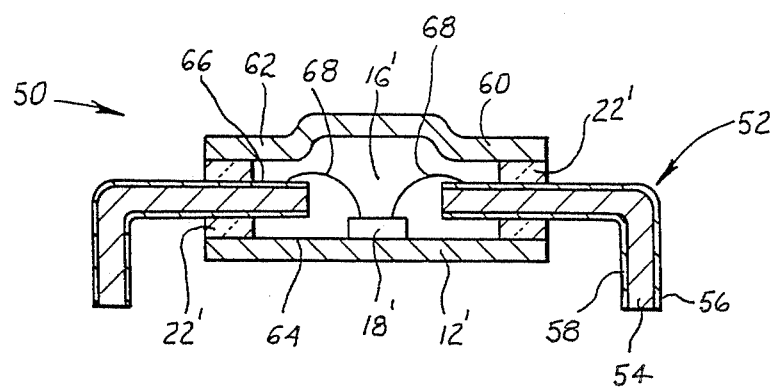
FIG. 3 is a cross section of a hermetically sealed semiconductor package having a tri-clad lead frame and based on the concepts set forth in the present invention.

Referring to FIG. 3, there is illustrated a third embodiment of a hermetically sealed semiconductor package 50 which includes a unique tri-clad lead frame 52. The core 54 of the lead frame 52 is preferably formed of a thermally stable, glass sealable alloy as described hereinabove. This alloy is selected for its ability to maintain its strength after thermal exposure during the glass sealing of the lead frame into the semiconductor package as will be further described hereinbelow. Also the alloy has a CTE which is compatible with the cladding, the other metal components of the package and the sealing glass. In addition, the alloy must be glass sealable so that the edges of the lead frame which have exposed core material can form a strong bond to the sealing glass. Generally, the minimum bend radius is dependent on alloy composition. For these alloys, optimal mechanical properties are normally achieved by a combination of cold reduction and the presence of a second phase. As the amount of residual cold work increases, the achievable minimum bend radius also increases. Also, for a given alloy and temper, the minimum bend radius is usually directly proportional to the strip thickness. Since these alloys have a relatively high temper, i.e. ranging from about 110 to about 127 ksi as described above, it is advantageous to select a thinner cross section in order to achieve a sharper bend. With CDA 72400 selected as the core material, its thickness would preferably be less than about 0.010 inches and the required bend for the core would be more than about 1 thickness (t). This is a favorable situation because the alloy 42 lead frame design which is currently favored in the electronics industry for lead frame application requires a one t bend (0.010 inch thick material has a 0.010 inch radius bend).

The two outer clad layers 56 and 58 are preferably formed of copper or copper base alloy materials capable of forming strong bonds to the sealing glass 22'. Reference numerals which are primed designate components which are essentially identical to the components designated by the unprimed reference numerals described hereinabove.

The copper or copper base alloys selected to form the claddings 56 and 58 have a relatively low oxidation rate and have relatively poor softening resistance when exposed to high temperatures in order that the formability is enhanced. Examples of these types of copper or copper base alloys commonly form a refractory oxide layer on their exposed surfaces in order to fulfill the requirement that the alloy be relatively oxidation resistant. These alloys may contain an effective amount of up to about 12% aluminum and the balance copper. Preferably, CDA Alloy C63800 as described in U.S. Pat. Nos. 3,676,292, 3,698,964, 3,730,779 and 3,810,754 are thought to be suitable. These alloys are hardened by cold working. When work hardened alloys are exposed to high temperatures, they have relatively poor softening resistance. This is particularly the case when comparing these metals to a precipitation hardenable alloy like CDA 72400. An example of the softening resistance of ¼ hard alloy C63800 is demonstrated by an experiment whose results are set forth in Table II below.

TABLE II

| | SOFTENING RESISTANCE* ¼ HD ALLOY 638 | | |
|---|---|---|---|
| Temperature | UTS (ksi) | .2% YS (ksi) | % Elongation (2" Guage) |
| Ambient | 97.7 | 75.4 | 18.0 |
| 400° C. | 87.3 | 68.3 | 25.0 |
| 405° C. | 89.0 | 67.8 | 24.5 |
| 410° C. | 87.3 | 65.3 | 26.0 |

*each sample given 30 min. at 340° C. + 15 min. at softening temperature (No pre-oxidation).

As shown in Table II, short exposure of about 15 minutes below the estimated peak sealing temperatures results in a 10 ksi drop in UTS and a 7–10 ksi drop in YS. The softening of the clad materials 56 and 58, from exposure to sealing temperatures, is advantageous in the present invention. In a clad material, the outer fiber strain in a right angle bend is reduced as it is moved closer to the mid-line through the thickness of the tri-clad. Since the softer material is furtherest from the mid-line, it will not have a tendency to crack during the bending step. Further, the clad approach allows for a tighter bend with a smaller radius of curvature than might otherwise be achieved with a harder material such as monolithic CDA 72400.

The outer clad layers may be applied to the core by any conventional technique such as POSIT-BOND ® approach described in U.S. Pat. Nos. 3,397,045 or 4,404,264. Preferably, the outer layers are very thin as compared with the core. For example, each of the outer layers may be about one mil thick while the core is about 8 mils thick.

Referring again to FIG. 3, the process by which the casing 50 is assembled is described in order to better understand the interaction of the properties of the different materials to construct a superior semiconductor package. First, the sealing glass matrix is weighed, blended and melted. It is fritted by pouring into water or through water cooled rolls. The dried frit is milled to a standard of about 5% on a 400 mesh screen with no residue on a 100 mesh screen. A filler, usually calcium fluoride, is milled and mixed with the glass in proportion of about 12 to about 20 parts of filler per 100 parts of glass. The exact ratio of filler to glass matrix is adjusted to give a coefficient of thermal expansion compatible with the base, lid and lead frame.

Next, 100 parts of the glass filler mixture is blended with about 2 to about 10 parts of a binder such as Elvacite ®, a product of DuPont Corporation, and with about 25 to about 40 parts of a conventional vehicle such as terpeneol. The result is a paste with a viscosity of approximately 30,000 poises.

The material for the base, seal ring, and lid or cover member is cut and formed to the desired shape. Then it is cleaned by conventional metal cleaning procedures. The sealing glass paste 22' described above is applied to the base 12' and lid 60' in a conventional screen printing operation. This operation applies the glass in a predetermined pattern around the periphery of the base and lid leaving uncoated areas in the middle of the base where the die will later be attached. The coated lid and base are then heated to remove the vehicle; then heated further to remove the binder; finally heated still further to a temperature in the vicinity of 380° C. to sinter the glass and filler particles to the base and/or seal ring.

The tri-clad material for the lead frame 52' as described above, is prepared and stamped or etched into the desired pattern. The material is then cleaned in accordance with conventional metal cleaning procedures. The lead frame 52' is then placed on top of a glass coated base or substrate 12' and the assembly is fired at a temperature of about 400 to about 475° C. for about 5 to about 15 minutes. In this operation, the coating flows into a continuous glaze 22'. The lead frame sinks into and bonds to the glaze such that glass flows around the openings in the lead frame but does not cover its upper surface 66. At this stage, a die 18' is attached to the base by any conventional means. Application of this seal usually involves heating the assembly to a temperature of about 400 to about 450° C. Lead wires 68 are now bonded between the die and the inner ends of the lead frame. The package is finally sealed by placing a coated lid or cover member onto the upper surface of the lead frame and heating the assembly to a temperature of about 400 to about 475° C. for about an additional 5 to about 15 minutes to melt the glass on the cover and hermetically seal the package. Since glass protrudes above the top surface 66 of the lead frame as a result of the bonding of the lead frame to the base, a glass to glass seal is effected between the glass layer on the cover 60 and the glass extending through the holes in the lead frame. In addition, the glass coating on the cover bonds to the surface of the lead frame.

Since surface 66 has considerable thermal exposure, i.e. the time required to sink the lead frame into the glass on the base and then the time required to heat the lead frame so that the cover can be glass sealed to the base and lead frame structure, it is very important that the surface material of the lead frame has a low oxidation rate in order that the glass strongly bonds with the surface to insure leak free, hermetic seals. Alloys which form thin continuous refractory oxide layers, such as, for example, CDA 63800, are particularly useful in this application due to their resistance to oxidation. Another aspect of the invention is that the heating of the package normally softens work hardenable, copper lead frame alloys such as CDA 63800. Having a relatively soft cladding improves the formability of the lead frame in order that sharp beds can be achieved. However, the core 54, which is formed of a thermally stable, glass sealable alloy does not lose its strength when subjected to sealing temperatures for the time required to practice the present invention and the lead frame maintains its required rigidity. The composite lead frame and the base and lid are preferably constructed of a material which has a CTE that is compatible with that of the sealing glass 22'. As in the embodiment of FIG. 1, the base 12' and the lid 60 are preferably from thermally stable, glass sealable alloys such as CDA 72400. However, it is within the scope of the present invention to fabricate these two components from other alloys such as the types selected for the claddings 56 and 58 or any other type mentioned hereinabove. An important consideration in selecting the material and geometry for the base and lid is the need to construct a strong, rigid package which is resistant to flexure and corresponding breakage of the seals. This may be accomplished by the provision of a cladding as mentioned hereinabove.

Figure 4:
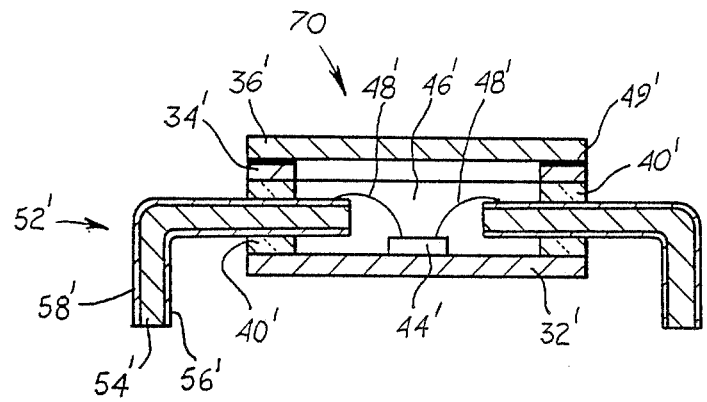
FIG. 4 is a cross section of a hermetically sealed window frame type semiconductor package having a tri-clad lead frame and based on the concepts set forth in the present invention.

The present invention may also be advantageously applied to a semiconductor pacakge 70 of the type shown in FIG. 4. This package includes a metal base member 32', a metal seal ring 34', a metal cover 36' and a metal lead frame 52'. The tri-clad lead frame 52' is formed of a core 54' and outer claddings 56' and 58. As mentioned hereinabove, the core is preferable of a glass sealable, thermally stable alloy of the type mentioned hereinabove; and the claddings are formed of materials which have a low oxidation rate and are glass sealable.

In this embodiment, the sealing glass matrix is weighed, blended and melted. It is fritted by pouring into water or through water cooled rolls. The dried frit is milled to a standard of about 5% on a 400 mesh screen with no residue on a 100 mesh screen. A filler, usually calcium fluoride, is milled and mixed with the glass in proportion of about 12 to about 20 parts of filler per 100 parts of glass. The exact ratio of filler to glass matrix is adjusted to give a coefficient of thermal expansion compatible with the base, seal ring, lid and lead frame.

Next, 100 parts of the glass filler mixture is blended with about 2 to about 10 parts of a binder such as Elvacite®, a product of DuPont Corporation, and with about 25 to about 40 parts of a vehicle such as terpeneol. The result is a paste with a viscosity of approximately 30,000 poises.

The material for the base, seal ring, and lid is cut and formed to the desired shape. Then it is cleaned by conventional metal cleaning procedures. The sealing glass paste 40' described above is applied to the base 32' or seal ring 40' in a conventional screen printing operation. This operation applies the glass in a predetermined pattern around the periphery of the base and seal ring leaving uncoated areas in the middle of the base or substrate where the die will later be attached. The coated seal ring and base are then heated to remove the vehicle; then heated further to remove the binder; finally heated still further to a temperature in the vicinity of 380° C. to sinter the glass and filler particles to the base and/or seal ring.

The tri-clad material for the lead frame 52' as described above, is prepared and stamped or etched into the desired pattern. The material is then cleaned in accordance with conventional metal cleaning procedures. The lead frame 52' is then placed on top of a glass coated base or substrate 32'; the seal ring 34' is placed on top of the lead frame and the total assembly is fired at a temperature of about 400 to about 475° C. for about 5 to about 15 minutes. In this operation, the coating flows into a continuous glaze 40' and the lead frame is sealed between the seal ring and the base. At this stage, a die 44' is attached to the base by any appropriate means. Application of this seal usually involves heating the assembly to a temperature of about 400 to about 475° C. Lead wires 48' are now bonded between the die and to inner ends of the lead frame. Finally, bonding means such as a glass, an oxygen stable solder or an adhesive is placed on the top of the seal ring and around the periphery of the lid. The lid is placed on top of the seal ring and the final assembly is fired to produce a hermetically sealed package. As with the embodiment of FIG. 2, the base, seal ring member and cover may be formed of a glass sealable, thermally stable alloy.

Figure 5:
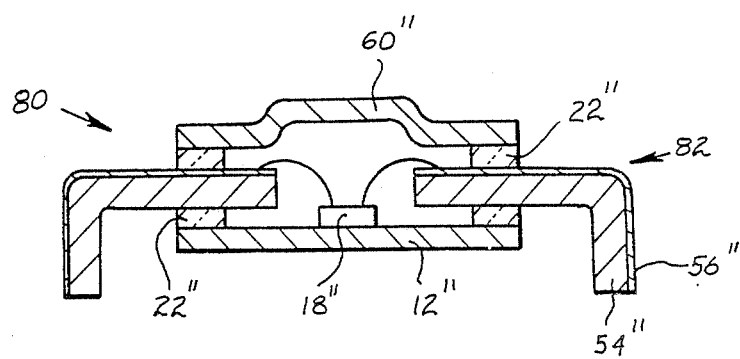
FIG. 5 is a cross section of a hermetically sealed semiconductor package having a bi-clad lead frame and based on the concepts set forth in the present invention.

Referring to FIG. 5, there is illustrated a fifth embodiment of a hermetically sealed semiconductor package 80 which includes a unique bi-clad lead frame 82. The core 54" of the lead frame 82 is preferably formed of a thermally stable, glass sealable alloy as described hereinabove. Reference numerals which are double primed designate components which are essentially identical to the components designated by the unprimed reference numerals described hereinabove. The alloy for the core is selected for its ability to maintain its strength after thermal exposure during the glass sealing of the lead frame into the semiconductor package and the cladding is selected from a glass sealable alloy with a low oxidation rate. Also, this alloy has a CTE which is compatible with the cladding 56", the base 12", the lid 60" and the glass 22". It is most important that the alloy selected for the cladding 56" has a CTE which is quite close to that of the core 54" in order that thermal exposure does not cause flexure of the lead frame. The semiconductor package 82 is fabricated in the same manner as described hereinabove with regard to the fabrication of the package 50 illustrated in FIG. 3. However, care must be taken to see that the lead frame 54''' is placed over the coated base with the cladding 58''' on the outer, non-glassed side.

Figure 6:
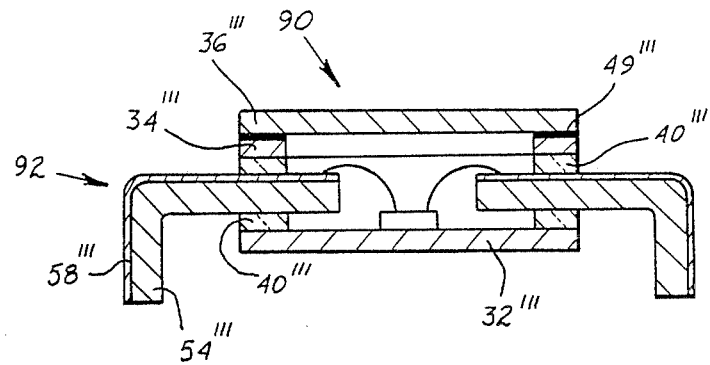
FIG. 6 is a cross section of a hermetically sealed window frame type semiconductor package having a bi-clad lead frame and based on the concepts set forth in the present invention.

The present invention may also be advantageously applied to a semiconductor package 90 of the type shown in FIG. 6. This package includes a metal base member 32''', a metal seal ring 34''', a metal cover 36''' and a metal bi-clad lead frame 92. The bi-clad lead frame 92 is formed of a core 54''' and outer cladding 58'''. The core is preferably of a glass sealable, thermally stable alloy of the type mentioned hereinabove; and the cladding is formed of material which has a low oxidation rate and is glass sealable. Reference numerals which are triple primed designate components which are essentially identical to the components designated by the unprimed reference numerals described hereinabove. The package 90 is constructed in essentially the same manner as described with respect to the embodiment 70 illustrated in FIG. 4. Further, although the bi-clad is illustrated with the clad layer 58''' being opposite the seal ring 34''', it is also within the scope of the present invention to dispose the clad layer opposite to the base 32'''.

The patents, patent applications and articles set forth in this application are intended to be incorporated by reference herein.

It is apparent that there has been provided in accordance with this invention a hermetically sealed semiconductor package which satisfies the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternative, modifications and all variations as fall within the spirit and broad scope of the appended claims.

What is claimed:

1. A semiconductor package, comprising:
a substrate member of a first alloy;
a cover member of a second alloy;
a clad lead frame comprising a core layer of a third alloy and a first outer layer of a fourth alloy, said clad lead frame being disposed between said substrate member and said cover member;

said third alloy being a thermally stable, glass sealable alloy which maintains or increases in yield strength at temperatures of less than about 475° C. for the time required to glass seal and has a coefficient of thermal expansion of about $140 \times 10^{-7}$ to about $180 \times 10^{-7}$ in/in/°C.;

said fourth alloy being oxidation resistant and decreasing in yield strength at temperatures of less than about 475° C. for the time required to glass seal and having a coefficient of thermal expansion compatible with said third alloy; and a sealing glass with a melting temperature of less than about 450° C. comprising a glass matrix selected from the group consisting of borate, lead borate, lead-zinc borate, borosilicate, lead borosilicate and lead-zinc borosilicate glasses, said sealing glass having a paritculate additive having a solubility of less than about 10% in said glass matrix mixed into said glass matrix to increase the coefficient of thermal expansion of said sealing glass to from about $140 \times 10^{-}$ to about $180 \times 10^{-7}$ in/in/° C. so as to be compatible with said first, second, third and fourth alloys, said sealing glass being disposed between said substrate member and said cover member for sealing said package.

2. The semiconductor package of claim 1 wherein said third alloy is selected from the group consisting of precipitation hardenable alloys; dispersion strengthened copper alloys and austenitic stainless steels.

3. The semiconductor package as in claim 2 wherein said particulate additive is substantially undissolved in said glass matrix so as to increase the coefficient of thermal expansion of the resulting sealing glass to approximately match the coefficients of thermal expansion of said first, second, third and fourth alloys.

4. The semiconductor package as in claim 3 wherein said particulate additive is selected from the group consisting of calcium fluoride and barium fluoride.

5. The semiconductor package as in claim 4 wherein said fourth ally consists essentially from about 1% by weight to about 12% by weight aluminum and the balance essentially copper.

6. The semiconductor package as in claim 5 wherein said fourth copper alloy consists essentially of about 2.5% by weight to about 3.1% by weight aluminum, about 1.5% by weight to about 2.1% by weight silicon and the balance essentially copper.

7. The semiconductor package as in claim 4 wherein said first, second and fourth alloys are substantially the same material.

8. The semiconductor package as in claim 2 wherein said clad lead frame has a second outer layer of said third alloy whereby said core layer is disposed between said first and second outer layers.

9. A semiconductor package, comprising:
a substrate member of a first alloy;
a cover member of a second alloy;
a clad lead frame comprising a core layer of a third alloy and a first outer layer of a fourth copper alloy;
said third alloy being a thermally stable, glass sealable alloy which maintains or increases in yield strength at temperatures of less than about 475° C. and at times required to glass seal and has a coefficient thermal expansion of from about $140 \times 10^{-7}$ to about $180 \times 10^{-7}$ in/in/° C;
said fourth alloy being oxidation resistant and decreasing in yield strength at temperatures of less than about 475° C. during the time required to glass seal and having a coefficient of thermal expansion compatible with said third alloy;
a seal ring member of a fifth alloy;
said clad lead frame being disposed between said substrate member and said seal ring member;
a sealing glass with a melting temperature of less than about 450° C. comprising a glass matrix selected from the group consisting of borate; lead borate, lead-zinc borate, borosilicate, lead borosilicate and lead-zinc borosilicate glass, said sealing glass having a particulate additive having a solubility of less than about 10% in said glass matrix mixed into said glass matrix to increase the coefficient of thermal expansion of said sealing glass to from about $140 \times 10^{-7}$ to about $180 \times 10^{-7}$ in/in/° C. so as to be compatible with said first, third, fourth and fifth alloys, said sealing glass being disposed between said substrate member and said seal ring member for sealing said clad lead frame therebetween; and
means bonding said seal ring member to said cover member whereby said package is substantially hermetically sealed.

10. The semiconductor package of claim 9 wherein said third alloy is selected from the group consisting of precipitation hardenable alloys; dispersion strengthened copper alloys and austenitic stainless steels.

11. The semiconductor package as in claim 10 wherein said particulate additive is substantially dissolved in said glass matix so as to increase the coefficient of thermal expansion of the resulting sealing glass to approximately match the coefficients of thermal expansion of said first, third, fourth and fifth alloys.

12. The semiconductor package as in claim 11 wherein said particulate additive is selected from the group consisting of calcium fluoride and barium fluoride.

13. The semiconductor package as in claim 11 wherein said first, second, fourth and fifth alloys are substantially the same material.

14. The semiconductor casing as in claim 12, wherein said bonding means comprises solder.

15. The semiconductor package as in claim 10 wherein said clad lead frame has a second outer layer of said third alloy whereby said core layer is disposed between said first and second outer layers.

16. A semiconductor package, comprising:
a substrate member of a first alloy,
a cover member of a second alloy,
a lead frame of a third alloy being disposed between said substrate member and said cover member said third alloy being a thermally stable, glass sealable alloy which maintains or increases in yield strength at temperatures of less than about 475° C. for the time required to glass seal and has a coefficient of thermal expansion of from about 140 to about $180 \times 10^{-7}$ in/in/° C.; and
a sealing glass with a melting temperature of less than about 450° C. selected from the group consisting of lead borate, lead-zinc borate, lead borosilicate and lead-zinc boosilicate glass, said sealing glass having an additive to modify the thermal expansion of said sealing glass whereby the resulting sealing glass composite has a coefficient of thermal expansion which is compatible with said first, second and third alloys, said sealing glass composite being disposed between said substrate member and said cover member for sealing said clad lead frame therebetween.

17. The semiconductor package of claim 16 wherein said third alloy is selected from the group consisting of precipitation hardenable copper alloys including beryllium containing copper alloys, magnesium-zirconium-chromium containing copper alloys, nickel-phosphorous containing copper alloys, copper-nickel-tin precipitation hardenable spinodol alloys; dispersion strengthened copper alloys and austenitic stainless steels.

18. The semiconductor package of claim 17 wherein said third alloy is a precipitation hardenable copper alloy consisting essentially of about 10% to about 15% by weight nickel, from about 1% to about 3% by weight aluminum and the remainder copper.

19. The semiconductor package as in claim 18 wherein said third alloy further consists essentially of up to about 1% by weight manganese, from about 0.05% to less than about 0.5% by weight magnesium and less than about 0.05% by weight silicon.

20. The semiconductor package as in claim 19 wherein said third alloy consists essentially of nickel from about 11.5% by weight to about 12.5% by weight, aluminum from about 1.8% by weight to about 2.3% by weight, magnesium from about 0.1% by weight to about 0.3% by weight and manganese from about 0.2% by weight to about 0.5% by weight.

21. The semiconductor package as in claim 17 wherein said sealing glass composite further comprises a substantially undissolved particulate additive to increase the coefficients of thermal expansion of the resulting sealing glass composite to approximately match the coefficients of thermal expansion of said first, second and third alloys.

22. The semiconductor package as in claim 21 wherein said additive of the sealing glass composite is selected from the group consisting essentially of calcium fluoride and barium fluoride.

23. The semiconductor package as in claim 22 wherein said first and second alloy consist essentially from about 1% by weight to about 12% by weight aluminum and the balance essentially copper.

24. The semiconductor package as in claim 23 wherein said first and second alloy consist essentially of about 2.5% by weight to about 3.1% by weight aluminum, about 1.5% by weight to about 2.1% by weight silicon and the balance essentially copper.

25. The semiconductor package as in claim 22 wherein said first, second and third alloys are substantially the same material.

26. A semiconductor package, comprising:
a substrate member of a first alloy;
a cover member of a second alloy;
a lead frame of a third alloy, said third alloy being a thermally stable, glass sealable alloy which maintains or increases in yield strength at temperatures less about 475° C. for the time required to glass seal and has a coefficient of thermal expansion of from about 140 to about $180 \times 10^{-7}$ in/in/° C.;
a seal ring member of a fourth alloy;
said clad lead frame being disposed between said substrate member and said seal ring member;
a sealing glass with a melting temperature of less than about 450° C. selected from the group consisting of a lead borate, lead-zinc borate, lead borosilicate and lead-zinc borosilicate glass, said sealing glass having an additive to modify the thermal expansion of said sealing glass whereby the resulting sealing glass composite has a coefficient of thermal expansion which is compatible with said first, third and fourth alloys, said sealing glass composite being disposed between said substrate member and said seal ring member for sealing said lead frame therebetween; and
means bonding said seal ring member to said cover member whereby said package is substantially hermetically sealed.

27. The semiconductor package of claim 26 wherein said third alloy is selected from the group consisting of precipitation hardenable copper alloys including beryllium containing copper alloys, magnesium-zirconium-chromium containing copper alloys, nickel-phosphorous containing copper alloys, copper-nickel-tin precipitation hardenable spinodol alloys, dispersion strengthened copper alloys and austenitic stainless steels.

28. The semiconductor package of claim 27 wherein said third alloy is a precipitation hardenable copper alloy consisting essentially of about 10% to about 15% by weight nickel, from about 1% to about 3% by weight aluminum and the remainder copper.

29. The semiconductor package as in claim 28 wherein said third alloy further consists essentially of up to about 1% by weight manganese, from about 0.05% to less than about 0.5% by weight magnesium and less than about 0.05% by weight silicon.

30. The semiconductor package as in claim 29 wherein said third alloy consists essentially of nickel from about 11.5% by weight to about 12.5% by weight, aluminum from about 1.8% by weight to about 2.3% by weight, magnesium from about 0.1% by weight to about 0.3% by weight and manganese from about 0.2% by weight to about 0.5% by weight.

31. The semiconductor package as in claim 30 wherein said sealing glass composite further comprises a substantially undissolved particulate additive to increase the coefficient of thermal expansion of the resulting sealing glass composite to approximately match the coefficients of thermal expansion of said first, third and fourth alloys.

32. The semiconductor package as in claim 31 wherein said additive of the sealing glass composite is selected from the group consisting essentially of calcium fluoride and barium fluoride.

33. The semiconductor package as in claim 32 wherein said first, second, third and fourth alloys are substantially the same material.

34. The semiconductor casing as in claim 32 including the step of bonding said seal cover to said seal ring with a material selected from the group consisting of an adhesive, a glass and an oxygen stable solder.

35. The semiconductor package of claim 2 wherein said precipitation hardenable alloy comprises copper alloys, beryllium containing copper alloys, magnesium-zirconium-chromium containing copper alloys, nickel-phosphorous containing copper alloys and copper-nickel-tin precipitation hardenable spinodal alloys.

36. The semiconductor package of claim 35 wherein said third alloy is a precipitation hardenable copper alloy consisting essentially of about 10% to about 15% by weight nickel, from about 1% to about 3% by weight aluminum and the remainder copper.

37. The semiconductor package as in claim 36 wherein said third alloy further consists essentially of up to about 1% by weight manganese, from about 0.05% to less than about 0.5% by weight magnesium, and less than about 0.05% by weight silicon.

38. The semiconductor package as in claim 37 wherein said third alloy consists essentially of nickel from about 11.5% by weight to about 12.5% by weight, aluminum from about 1.8% by weight to about 2.3% by weight, magnesium from about 0.1% by weight to about 0.3% by weight and manganese from about 0.2% by weight to about 0.5% by weight.

39. The semiconductor package of claim 10 wherein said precipitation hardenable alloy comprises copper alloys, beryllium containing copper alloys, magnesium-zirconium-chromium containing copper alloys, nickel-phosphorous containing copper alloys and copper-nickel-tin precipitation hardenable spinodal alloys.

40. The semiconductor package of claim 39 wherein said third alloy is a precipitation hardenable copper alloy consisting essentially of about 10% to about 15% by weight nickel, from about 1% to about 3% by weight aluminum and the remainder copper.

41. The semiconductor package as in claim 40 wherein said third alloy further consists essentially of up to about 1% by weight manganese, from about 0.05% to less than about 0.5% by weight magnesium and less than about 0.05% by weight silicon.

42. The semiconductor package as in claim 41 wherein said third alloy consists essentially of nickel from about 11.5% by weight to about 12.5% by weight, aluminum from about 1.8% by weight to about 2.3% by weight, magnesium from about 0.1% by weight to about 0.3% by weight and manganese from about 0.2% by weight to about 0.5% by weight.

43. A semiconductor package, comprising:
   a substrate member of a first metal alloy;
   a cover member of a second metal alloy;
   a leadframe comprising a third metal alloy, said third metal alloy comprising a precipitation hardenable metal alloy consisting essentially of about 10% to about 15% by weight nickel, from about 1% by about 3% by weight aluminum and the remainder copper, said leadframe being disposed between said substrate member and said cover member; and
   a sealing glass being disposed between said substrate member and said cover member for sealing said package.

44. The semiconductor package of claim 43 wherein said sealing glass comprises:
   a glass matrix having a firing temperature of less than about 450° C.; and
   a particulate additive having limited solubility in said glass matrix mixed into said glass matrix to increase the effective coefficient of thermal expansion of the resulting sealing glass to about $140 \times 10^{-7}$ to about $180 \times 10^{-7}$ in/in/° C. so as to be compatible with the coefficient of thermal expansion of the first, second and third alloys.

45. The semiconductor package of claim 44 wherein said glass matrix is selected from the group consisting of borate, lead borate, lead-zinc borate, borosilicate, lead borosilicate and lead-zinc borosilicate glasses.

46. The semiconductor package of claim 45 wherein at least one of said first and second alloys is a precipitation hardenable copper alloy.

47. The semiconductor package of claim 46 wherein said particulate additive is selected from the group consisting of calcium fluoride and barium fluoride.

48. The semiconductor package of claim 47 wherein said first, second and third alloys are formed of precipitation hardenable copper alloys.

49. A semiconductor package comprising:
   a substrate member of a first metal alloy;
   a cover member of a second metal alloy;
   a leadframe comprising a third metal alloy, said third metal alloy consisting essentially of from about 10% to about 15% by weight nickel, from about 1% to about 3% by weight aluminum and the remainder copper;
   a seal ring member of a fourth metal alloy, said leadframe being disposed between said substrate member and said seal ring member;
   a sealing glass being disposed between said substrate member and said seal ring member for sealing said leadframe therebetween; and
   means bonding said seal ring member to said cover member whereby said package is substantially hermetically sealed.

50. The semiconductor package of claim 48 wherein said sealing glass comprises:
   a glass matrix having a firing temperature of less than about 450° C.; and
   a particulate additive having limited solubility in said glass matrix mixed into said glass matrix to increase the effective coefficient of thermal expansion of the resulting sealing glass to about $140 \times 10^{-7}$ to about $180 \times 10^{-7}$ in/in/° C. so as to be compatible with the coefficient of thermal expansion of the first, second and third alloys.

51. The semiconductor package of claim 50 wherein said glass matrix is selected from the group consisting of borate, lead borate, lead-zinc borate, borosilicate, lead borosilicate and lead-zinc borosilicate glasses.

52. The semiconductor casing of claim 51 wherein the bonding means is selected from the group consisting of an adhesive, a glass and oxygen stable solder.

53. A semiconductor package, comprising:
   a substrate member of a first alloy;
   a cover member of a second alloy;
   at least one of said first and second alloys comprising a precipitation hardenable alloy;
   a leadframe comprising a third metal alloy, said third metal alloy comprising a precipitation hardenable metal alloy consisting essentially of from about 10% to about 15% by weight nickel, from about 1 to about 3% by weight aluminum and the remainder copper; and
   a sealing glass bonding said substrate member to said cover member for sealing said package.

54. The semiconductor package of claim 53 wherein said sealing glass comprises:
   a glass matrix fired at a temperature of less than about 450° C.; and
   a particulate additive having limited solubility in said glass matrix mixed into such glass matrix to increase the effective coefficient of thermal expansion of the resulting sealing glass to about $140 \times 10^{-7}$ to about $180 > 10^{-7}$ in/in/° C. so as to be compatible with the coefficient of thermal expansion of the first, second and third alloys.

55. The semiconductor package of claim 3 wherein said particulate additive is uncoated; and
   said glass matrix is formed of a vitreous glass.

56. The semiconductor package of claim 11 wherein said particulate additive is uncoated; and
   said glass matrix is formed of a vitreous glass.

57. The semiconductor package of claim 44 wherein said particulate additive is uncoated; and
   said glass matrix is formed of a vitreous glass.

58. The semiconductor package of claim 50 wherein said particulate additive is uncoated; and
   said glass matrix is formed of vitreous glass.

59. The semiconductor package of claim 54 wherein said particulate additive is uncoated; and
   said glass matrix is formed of vitreous glass.

* * * * *

UNITED STATES PATENT AND TRADEMARK OFFICE
CERTIFICATE OF CORRECTION

PATENT NO. : 4,805,009
DATED : February 14, 1989
INVENTOR(S) : Michael J. Pryor et al It is certified that error appears in the above-identified patent and that said Letters Patent is hereby corrected as shown below:

Column 13, line 21, please delete "140 x 10$^-$" and insert ---140 x 10$^{-7}$--- in its place.

Column 13, line 40, please delete "ally" and insert ---alloy--- in its place.

Column 14, line 31, please delete "matix" and insert ----matrix--- in its place.

Column 14, line 62, please delete "boosilicate" and insert ---borosilicate--- in its place.

Column 18, line 53, please delete ">" and insert ---x--- in its place.

Column 18, line 40, please insert ---%--- after "1".

Signed and Sealed this

Twelfth Day of May, 1992

Attest:

DOUGLAS B. COMER

Attesting Officer

Acting Commissioner of Patents and Trademarks